United States Patent
Lee et al.

(10) Patent No.: US 8,927,995 B2
(45) Date of Patent: Jan. 6, 2015

(54) THIN FILM TRANSISTOR WITH ANTI-DIFFUSION AREA THAT PREVENTS METAL ATOMS AND/OR IONS FROM SOURCE/DRAIN ELECTRODES FROM SHORTENING THE CHANNEL LENGTH AND DISPLAY SUBSTRATE HAVING THE THIN FILM TRANSISTOR

(75) Inventors: Hong Koo Lee, Incheon-si (KR); Sang Hoon Jung, Seoul (KR)

(73) Assignee: LG Display Co., Ltd., Seoul (KR)

(*) Notice: Subject to any disclaimer, the term of this patent is extended or adjusted under 35 U.S.C. 154(b) by 632 days.

(21) Appl. No.: 11/581,619

(22) Filed: Oct. 16, 2006

(65) Prior Publication Data

US 2007/0262313 A1 Nov. 15, 2007

(30) Foreign Application Priority Data

May 15, 2006 (KR) .................. 10-2006-0043247
Sep. 14, 2006 (KR) .................. 10-2006-0088989

(51) Int. Cl.
| | | |
|---|---|---|
| H01L 27/14 | (2006.01) |
| H01L 29/04 | (2006.01) |
| H01L 29/15 | (2006.01) |
| H01L 31/036 | (2006.01) |
| H01L 29/76 | (2006.01) |
| H01L 29/417 | (2006.01) |
| H01L 29/08 | (2006.01) |
| H01L 29/786 | (2006.01) |
| H01L 29/06 | (2006.01) |

(52) U.S. Cl.
CPC ....... *H01L 29/78606* (2013.01); *H01L 29/0657* (2013.01); *H01L 29/0603* (2013.01); *H01L 29/0847* (2013.01); *H01L 29/78618* (2013.01)
USPC .. 257/72; 257/288; 257/E29.117; 257/E29.12

(58) Field of Classification Search
CPC ............ H01L 29/0657; H01L 29/0603; H01L 29/0847; H01L 29/78618; H01L 29/78606
USPC ....... 257/72, 751, 767, 288, E29.117, E29.12
See application file for complete search history.

(56) References Cited

U.S. PATENT DOCUMENTS 7,335,573 B2 * 2/2008 Takayama et al. ............ 438/455
2004/0135143 A1 7/2004 Harano et al.
(Continued)

FOREIGN PATENT DOCUMENTS

| JP | 06-067207 | 3/1994 |
| JP | 2000-292808 | 10/2000 |

(Continued)

OTHER PUBLICATIONS

Combined Search and Examination Report dated May 4, 2007 for corresponding Great Britain Application No. GB0625318.1.

(Continued)

*Primary Examiner* — Phat X Cao
*Assistant Examiner* — Diana C Vieira
(74) *Attorney, Agent, or Firm* — Brinks Gilson & Lione

(57) ABSTRACT

A thin film transistor includes a semiconductor pattern disposed on a substrate and a semiconductor pattern portion with a conductive or nonconductive characteristic, and a anti-diffusion portion on a side of the semiconductor pattern portion to prevent metal ions from being diffused along the semiconductor pattern portion. A first insulating layer covers the semiconductor pattern and has a first contact hole exposing a first region of the semiconductor pattern portion and a second contact hole exposing a second region of the semiconductor pattern portion. A gate electrode is disposed on the first insulating layer. A second insulating layer covers the gate electrode and has a third contact hole exposing the first region and a fourth contact hole exposing the second region. A source electrode is formed on the second insulating layer and connected to the first region, and a drain electrode is formed on the second insulating layer and connected to the second region.

2 Claims, 12 Drawing Sheets

(56) References Cited

U.S. PATENT DOCUMENTS

2005/0133793 A1\* 6/2005 Kim .................................. 257/72
2005/0282305 A1\* 12/2005 Murakami et al. .............. 438/30
2006/0097258 A1\* 5/2006 Yamazaki et al. .............. 257/59
2006/0192907 A1\* 8/2006 Kwon et al. .................... 349/43
2006/0220014 A1\* 10/2006 Hirano et al. ................... 257/59

FOREIGN PATENT DOCUMENTS

| JP | 2001-074637 | 3/2001 |
| JP | 2005-196172 | 7/2005 |

OTHER PUBLICATIONS

Office Action issued in corresponding Japanese Patent Application No. 2010-219782, mailed Apr. 10, 2012, 6 pages.

\* cited by examiner

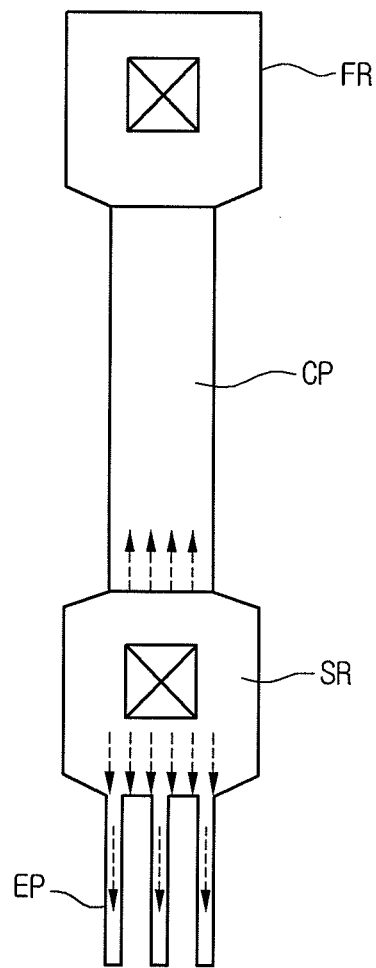

THIN FILM TRANSISTOR WITH ANTI-DIFFUSION AREA THAT PREVENTS METAL ATOMS AND/OR IONS FROM SOURCE/DRAIN ELECTRODES FROM SHORTENING THE CHANNEL LENGTH AND DISPLAY SUBSTRATE HAVING THE THIN FILM TRANSISTOR

PRIORITY CLAIM

This application claims priority to and the benefit of Korea Patent Application Nos. 43247/2006, filed May 15, 2006 and 88989/2006, filed on Sep. 14, 2006, the disclosure of which is incorporated herein by reference.

FIELD OF THE INVENTION

The present invention relates to a thin film transistor, a method of manufacturing the thin film transistor, and a display substrate having the thin film transistor.

BACKGROUND

As semiconductor devices such as a thin film transistor (TFT) are developed, information processing devices are developed which can process more data within a short time. Display devices for displaying the processed data are also in rapid progress.

Examples of the display devices include a liquid crystal display device (LCD), an organic light emitting device (OLED), and a plasma display panel (PDP).

The display devices commonly include TFTs so as to display full-color images. Specifically, display devices having low temperature polysilicon (LTPS) TFTs have been recently introduced.

In the LTPS technology, a channel layer of a TFT for an active matrix display device is formed of polysilicon having higher electron mobility than amorphous silicon. Also, since a driving circuit for controlling a display device can be directly formed on a display substrate, it is unnecessary to arrange separate drive ICs around a display panel. Therefore, the number of components can be reduced compared with a display device using amorphous silicon. The LTPS fabrication technology can provide a display device having characteristics of high durability, slimmer profile, higher brightness, and low power consumption.

In the LTPS TFT, a polysilicon pattern is directly formed on a display substrate, and a gate electrode is formed on the polysilicon pattern. A source electrode and a drain electrode are formed on the polysilicon pattern. A contact hole is formed on an insulating layer between the polysilicon pattern and the gate electrode. The source electrode and the drain electrode are electrically connected to the polysilicon pattern through the contact hole.

However, metal ions of the source electrode and the drain electrode are diffused from the source electrode and the drain electrode to the polysilicon pattern. Especially, after forming a passivation layer on the substrate where an annealing process is performed for remove hydrogen included the passivation layer. In this process, because of the temperature of the annealing process is about 200° C. to 400° C., metal ions or atoms of the source electrode and the drain electrode are diffused from the source electrode and the drain electrode to the polysilicon pattern. Consequently, the length of the polysilicon pattern is gradually narrowed by the diffusion of the metal ions. In this case, the performance of the TFT is greatly degraded and the display quality of the image generated from the display device is also degraded.

SUMMARY

In accordance with one embodiment of the invention, as embodied and broadly described herein, there is provided a thin film transistor including a semiconductor pattern disposed on a substrate. The semiconductor pattern has a semiconductor pattern portion with a conductive or nonconductive characteristic, and a anti-diffusion portion adjacent to a side of the semiconductor pattern portion and configured to prevent metal ions from being diffused along the semiconductor pattern portion. A first insulating layer covers the semiconductor pattern and has a first contact hole exposing a first region of the semiconductor pattern portion. A second contact hole exposes a second region of the semiconductor pattern portion. A gate electrode resides on the first insulating layer and a second insulating layer covers the gate electrode. The second insulating layer has a third contact hole exposing the first region and a fourth contact hole exposing the second region. A source electrode overlies the second insulating layer and is connected to the first region and a drain electrode overlies the second insulating layer and is connected to the second region.

In accordance with another aspect of the present invention, there is provided a method of manufacturing a thin film transistor, including forming a semiconductor layer on a substrate and patterning the semiconductor layer to form a semiconductor pattern. The semiconductor pattern has a semiconductor pattern portion with a conductive or nonconductive characteristic, and a anti-diffusion portion formed in the semiconductor pattern portion to prevent metal ions from diffusing through the semiconductor pattern portion. A first insulating layer is formed covering the semiconductor pattern and A gate electrode is formed on the first insulating layer and in spaced relationship to the semiconductor pattern. A second insulating layer is formed covering the gate electrode. The first and second insulating layers are patterned to form first and second insulating layer patterns, the first and second insulating layer patterns having contact holes exposing first and second regions of the semiconductor pattern portion. A source electrode and a drain electrode are formed on the second insulating layer pattern, where the source electrode contacts the first region and the drain electrode contacts the second region.

According to a further aspect of the present invention, there is provided a display substrate including a first substrate and a thin film transistor on the first substrate. The thin film transistor has a semiconductor pattern portion with a conductive or nonconductive characteristic, and a gate electrode in spaced relationship to the semiconductor pattern portion. a source electrode electrically contacts a first region of the semiconductor pattern portion, and a drain electrode electrically contacts a second region of the semiconductor pattern portion. A anti-diffusion portion protrudes from a side of the semiconductor pattern portion along the substrate and is configured to prevent metal ions from being diffused from the source and drain electrodes toward the center of the semiconductor pattern portion.

According to a further aspect of the present invention, there is provided a thin film transistor including a semiconductor pattern disposed on a substrate and having a source region and a drain region separated by a channel region. A anti-diffusion structure resides adjacent to the semiconductor pattern. A gate electrode is in spaced relationship with the channel region and separated therefrom by a first insulating layer. A second insulating layer covers the gate electrode and a source electrode overlies the second insulating layer and contacts the source region. A drain electrode overlies the second insulating layer and contacts the drain region. The anti-diffusion structure is configured to conduct metal ions diffusing from the source electrode and the drain electrode away from the channel region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3A is a plan view illustrating a diffusion path of metal ions in a semiconductor pattern portion of FIG. 2 in accordance with one embodiment;

Figure 1:
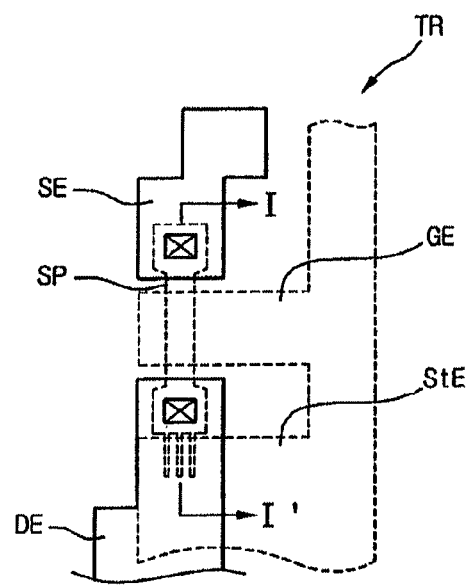
FIG. 1 is a plan view of a TFT according to an embodiment of the present invention.

In the drawings, the thicknesses of a semiconductor pattern, a first insulating layer, a gate electrode, a second insulating layer, a source electrode, a drain electrode, and other structures are exaggerated for clarity.

DETAILED DESCRIPTION

As used herein when a layer is referred to as being "on" another layer or substrate, it can be directly on the other layer or substrate, or intervening layers may also be present. When the semiconductor pattern, the first insulating layer, the gate electrode, the second insulating layer, the source electrode, the drain electrode, and other structures are referred to as "first", "second", "third" and/or "fourth", they should not be construed as limiting these members, but will be used for distinguish the semiconductor pattern, the first insulating layer, the gate electrode, the second insulating layer, the source electrode, the drain electrode, or other structures. Therefore, the terms "first", "second", "third" and "fourth" can be used selectively or interchangeably with respect to the semiconductor pattern, the first insulating layer, the gate electrode, the second insulating layer, the source electrode, the drain electrode, and other structures.

Thin Film Transistor

Figure 2:
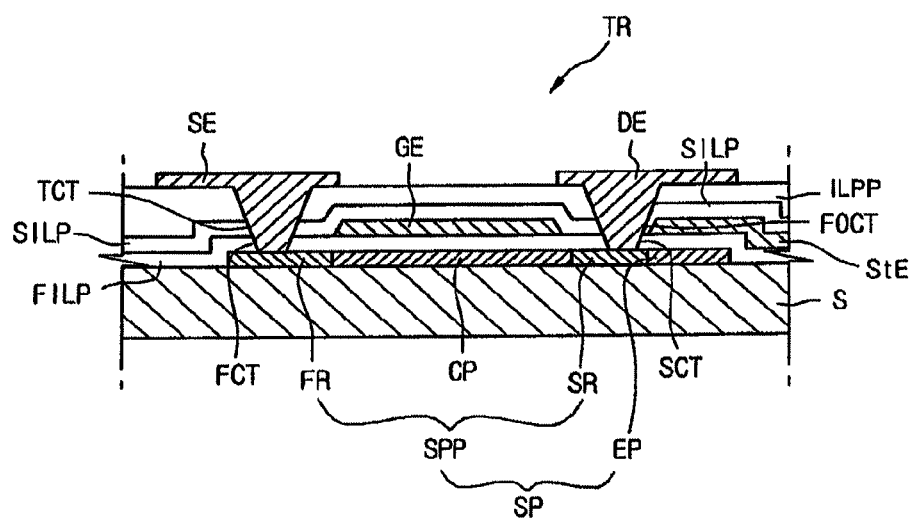
FIG. 2 is a sectional view taken along line I-I' of FIG. 1.

FIG. 1 is a plan view of a TFT according to an embodiment of the present invention, FIG. 2 is a sectional view taken along line I-I' of FIG. 1.

Referring to FIGS. 1 and 2, the TFT TR includes a semiconductor pattern SP, a first insulating layer pattern FILP, a gate electrode GE, a second insulating layer pattern SILP, a source electrode SE, and a drain electrode DE, which are formed on a substrate S.

The semiconductor pattern SP is disposed on the substrate S. In this embodiment, the semiconductor pattern SP includes polysilicon. The semiconductor pattern SP may generally have a dog-bone shape in a plan view.

For example, the dog-bone shaped semiconductor pattern SP includes a semiconductor pattern portion SPP and a anti-diffusion portion EP.

In this embodiment, the semiconductor pattern portion SPP has a conductive or nonconductive characteristic according to application/interrupt of an external voltage. Specifically, the semiconductor pattern portion SPP includes a first region FR, a second region SR, and a channel portion CP. The first region FR and the second region SR correspond to the source electrode SE and the drain electrode DE, respectively.

In the plan view, the first region FR is disposed at a first end of the semiconductor pattern portion SPP, and the second region SR is disposed at a second end opposite to the second end. N-type or p-type impurities are doped into the first region FR and the second region SR of the semiconductor pattern portion SPP, thus providing a conductive characteristic.

In addition, the channel portion CP is interposed between the first region FR and the second region SR. The channel portion CP has a conductive or nonconductive characteristic according to application/interrupt of an external voltage.

The anti-diffusion portion EP protrudes or extends from the semiconductor pattern portion SPP. The anti-diffusion portion EP prevents the diffusion of metal ions from the source electrode SE and the drain electrode DE to the channel portion CP of the semiconductor pattern portion SPP. The source electrode SE and the drain electrode DE are electrically connected to the first region FR and the second region SR of the semiconductor pattern portion SPP.

FIG. 3A is a plan view illustrating a diffusion path of the metal ions in a semiconductor pattern portion of FIG. 2 in accordance with one embodiment.

Referring to FIG. 3A, the first region FR of the semiconductor pattern portion SPP correspond to the source electrode SE and the drain electrode DE, respectively.

When the first region FR and the second region SR are connected to the source electrode SE and the drain electrode DE, respectively, the metal ions provided from the source electrode SE and the drain electrode DE are primarily diffused from the first region FR and the second region SR toward the channel portion CP. At this point, because the first region FR and the second region SR have conductive characteristics, the electrical characteristics of the first and second regions FR and SR are not affected even though the metal ions are diffused from the source electrode SE and the drain electrode DE toward the first and second regions FR and SR. That is, the first and second regions FR and SR continuously maintain their conductive characteristics.

On the other hand, when the metal ions provided from the source electrode SE and the drain electrode DE pass through the first and second regions FR and SR and are secondarily diffused to the channel portion CP, a length of the channel portion CP is reduced. Moreover, the channel portion CP may lose the semiconductor characteristic because of the diffusion of the metal ions provided from the source electrode SE and the drain electrode DE.

According to one aspect of the present invention, the metal ions moving toward the channel portion CP can be reduced by diffusing some of the metal ions toward the anti-diffusion portion EP. For this purpose, the anti-diffusion portion EP may be formed to protrude or extend along the side of the semiconductor pattern portion SPP. Accordingly, the anti-diffusion portion EP is configured to conduct at least a portion of metal species diffusing from the source electrode and the drain electrode away from the channel portion CP.

The anti-diffusion portion EP may have a pin shape as shown in FIG. 3A. In addition, two pin-shaped anti-diffusion portions EP may be arranged parallel to each other similar to the tines of a fork.

In this way, when the anti-diffusion portion EP is formed in the semiconductor pattern portion SPP, the metal ions diffusing toward the channel portion CP that are among the metal ions provided from the source electrode SE and the drain electrode DE, are diffused toward the anti-diffusion portion EP. Therefore, the diffusion direction of the metal ions from the source electrode SE and the drain electrode DE is dispersed.

By dispersing the diffusion direction of the metal ions from the source electrode SE and the drain electrode DE, it is possible to prevent shorting of the source electrode SE and the drain electrode DE, which is caused when the length of the channel portion CP is reduced and/or the channel portion CP becomes conductive.

Figure 3B:
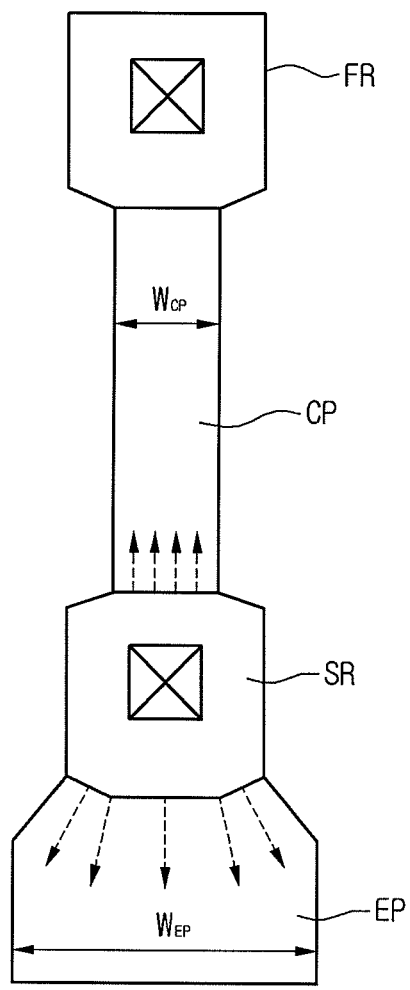
FIG. 3B is a plan view illustrating a diffusion path of metal ions in a semiconductor pattern portion of FIG. 2 in accordance with another embodiment.

Although the anti-diffusion portion EP illustrated herein has a pin shape, in accordance with other embodiments, the anti-diffusion portion EP can have various shapes. For example, the anti-diffusion portion EP may have a polygonal shape as shown in FIG. 3B. In the embodiment illustrated in FIG. 3B, the width $W_{EP}$ of the anti-diffusion portion EP is greater than the corresponding width $W_{CP}$ of the channel portion.

The anti-diffusion portion EP may be selectively formed only in proximity to the source electrode SE. Also, the anti-diffusion portion EP may be selectively formed in proximity to the drain electrode DE. Moreover, the anti-diffusion portion EP may be formed in proximity to both the source electrode SE and the drain electrode DE.

The anti-diffusion portion EP may protrude in a direction parallel to a length direction of the cuboid shaped semiconductor pattern portion SPP, such that the metal ions can be diffused more efficiently. Alternatively, the anti-diffusion portion EP may be formed in a radial direction with respect to the semiconductor pattern portion SPP.

Referring again to FIGS. 1 and 2, the first insulating layer pattern FILP is formed on the substrate S to cover the semiconductor pattern SP. The first insulating layer pattern FILP includes a first contact hole FCT exposing the first region FR and a second contact hole SCT exposing the second region SR. In this embodiment, because the first region FR and the second region SR are spaced apart from each other by a predetermined distance, the first contact hole FCT and the second contact hole SCT are also spaced apart from each other by a predetermined distance.

The gate electrode GE is formed on the first insulating layer pattern FILP. For example, the gate electrode GE is disposed between the first contact hole FCT and the second contact hole SCT. The gate electrode may be formed of aluminum, aluminum alloy, and aluminum-neodymium alloy.

The second insulating layer pattern SILP is formed on the first insulating layer pattern FILP, so that the gate electrode GE is covered by the second insulating layer pattern SILP. The second insulating layer pattern SILP insulates the gate electrode GE from an external conductor. In this embodiment, the second insulating layer pattern SILP has a third contact hole TCT exposing the first region FR and a fourth contact hole FOCT exposing the second region SR. An interlayer insulating layer pattern ILDP may be formed on the second insulating layer pattern SILP.

The source electrode SE is electrically connected to the first region FR through the first and third contact holes FCT and TCT formed in the first and second insulating layer patterns FILP and SILP.

The drain electrode DE is electrically connected to the second region SR through the second and fourth contact holes SCT and FOCT formed in the first and second insulating layer patterns FILP and SILP, respectively.

Method of Manufacturing TFT

Figure 4:
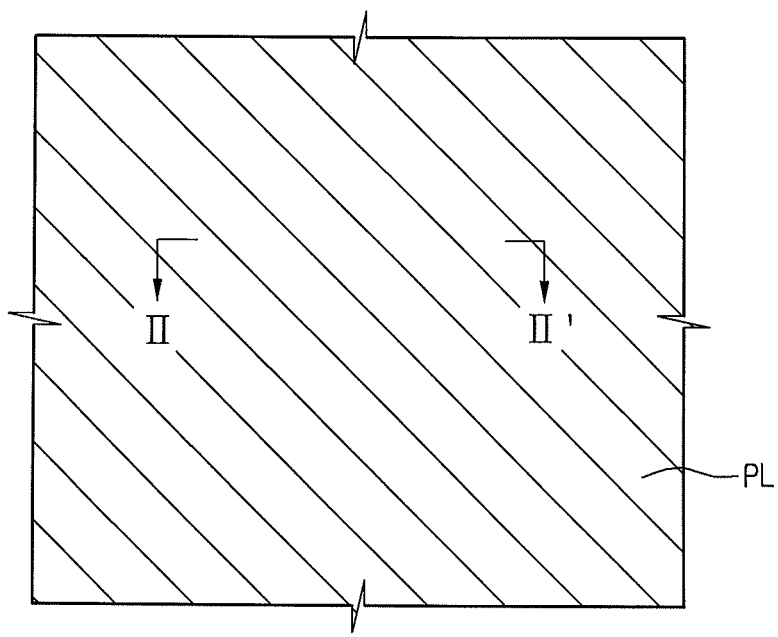
FIG. 4 is a plan view of a semiconductor layer formed by a method of manufacturing a TFT according to an embodiment of the present invention.
Figure 5:
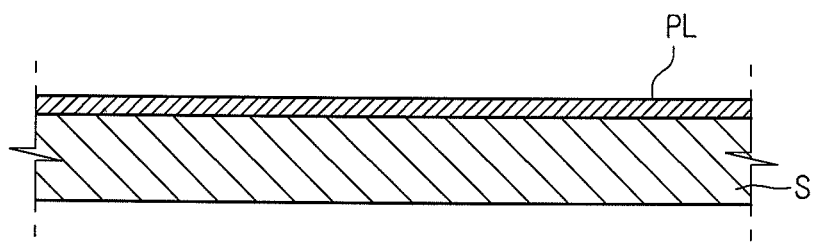
FIG. 5 is a sectional view taken along line II-II' of FIG. 4.

FIG. 4 is a plan view of a semiconductor layer formed by a method of manufacturing a TFT in accordance with an embodiment of the present invention, and FIG. 5 is a sectional view taken along line II-II' of FIG. 4.

Referring to FIGS. 4 and 5, a polysilicon layer PL is formed on a substrate S.

The forming of the polysilicon layer PL may include depositing an amorphous silicon layer on the substrate S and crystallizing the deposited amorphous silicon layer. The amorphous silicon layer may be formed using a chemical vapor deposition (CVD) process, and may be crystallized using a high-energy laser, such as YAG laser.

Figure 6:
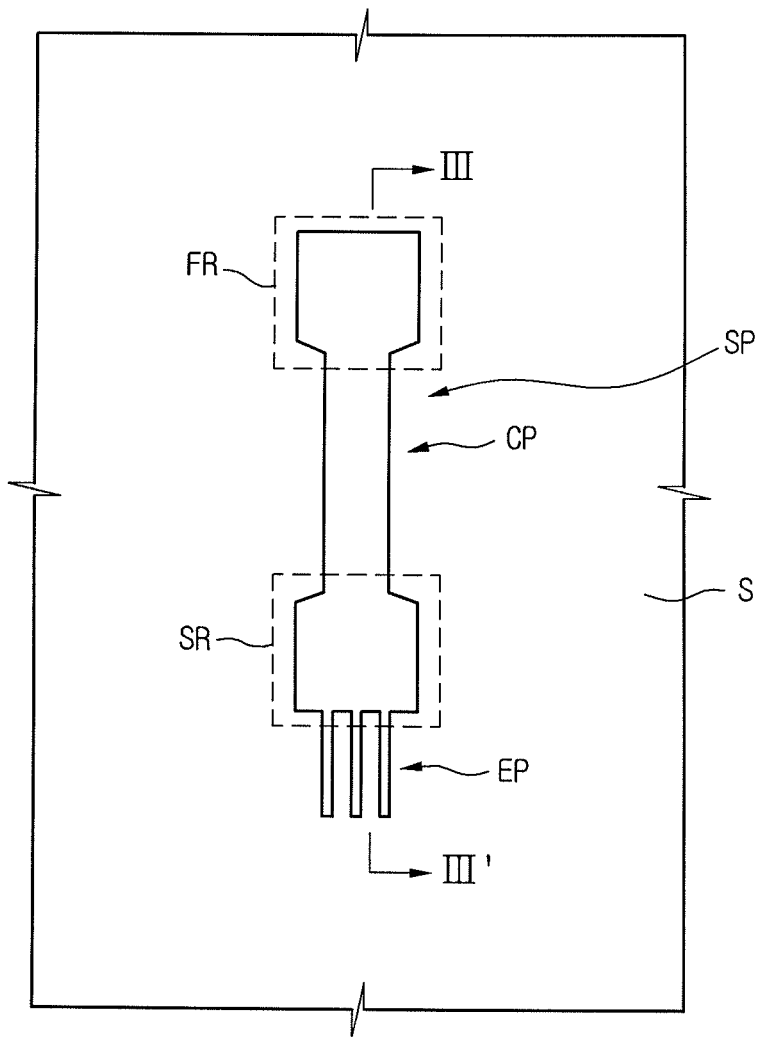
FIG. 6 is a plan view illustrating a patterned polysilicon layer.
Figure 7:
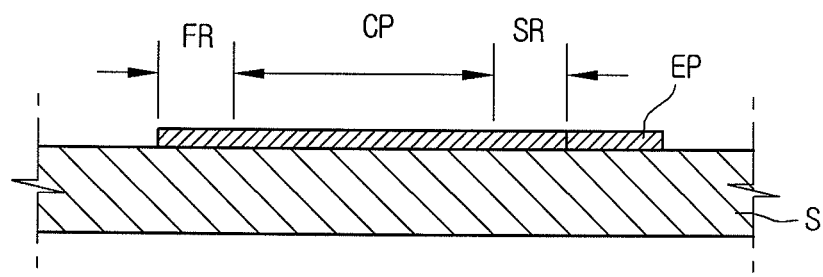
FIG. 7 is a sectional view taken along line III-III' of FIG. 6.

FIG. 6 is a plan view illustrating a patterned polysilicon layer, and FIG. 7 is a sectional view taken along line III-III' of FIG. 6.

Referring to FIGS. 6 and 7, after the polysilicon layer PL is formed on the substrate S, a photoresist pattern (not shown) is formed on the polysilicon layer PL.

In this embodiment, the forming of the photoresist pattern may include forming a photoresist film on the polysilicon layer PL, exposing the photoresist film using a pattern mask, and developing the exposed photoresist film. Alternatively, the photoresist pattern may be formed by disposing a photoresist substance on the polysilicon layer PL using an inkjet method.

Referring to FIGS. 6 and 7, the polysilicon layer PL is etched using the photoresist pattern as an etch mask, thereby forming a semiconductor pattern SP. Specifically, the polysilicon layer PL is patterned to form a semiconductor pattern SP having a semiconductor pattern portion SPP and a anti-diffusion portion EP. The semiconductor pattern portion SPP has a first region FR, a second region SR, and a channel portion CP.

In a plan view, the first region FR is formed in a first end of the semiconductor pattern SP, and the second region SR is formed in a second end opposite to the first end. The channel portion CP is interposed between the first region FR and the second region SR.

The anti-diffusion portion EP protrudes or extends along the substrate S from the semiconductor pattern SP corresponding to the first region FR and/or the second region SR.

In this embodiment, the anti-diffusion portion EP has a pin shape and extends along the substrate S from the second region SR of the semiconductor pattern SP. At least one pin-shaped anti-diffusion portion EP may be formed. The anti-diffusion portions EP may be arranged in parallel.

The anti-diffusion portion EP extends from the side of the cuboid shaped semiconductor pattern SP. For example, at least one anti-diffusion portion EP may extend in a direction parallel to a length direction of the semiconductor pattern SP. Alternatively, the anti-diffusion portion EP may be formed in a radial direction from the side of the semiconductor pattern SP corresponding to the first and second regions FR and SR.

The anti-diffusion portion EP may be formed in the semiconductor pattern SP corresponding to the first and second regions FR and SR. Also, the anti-diffusion portion EP may be selectively formed in the semiconductor pattern portion SPP corresponding to the first region FR. Alternatively, the anti-diffusion portion EP may be selectively formed in the semiconductor pattern portion SPP corresponding to the second region SR.

In FIG. 6, the anti-diffusion portion EP is selectively formed in the second region SR that is electrically connected to the drain electrode DE.

Figure 8:
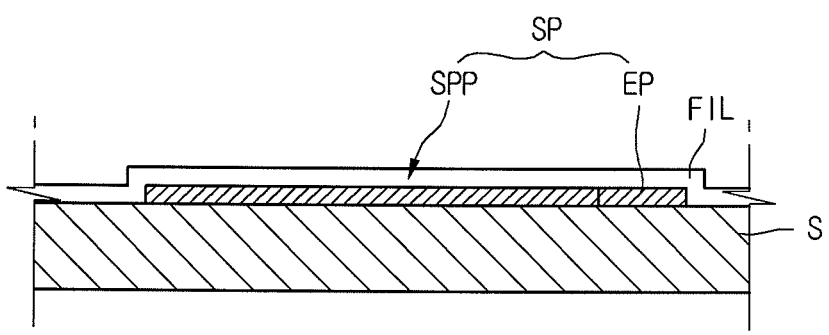
FIG. 8 is a sectional view of a first insulating layer covering a semiconductor pattern of FIG. 7.

FIG. 8 is a sectional view of a first insulating layer covering the semiconductor pattern of FIG. 7.

Referring to FIG. 8, after the semiconductor pattern SP having the semiconductor pattern portion SPP and the anti-diffusion portion EP is formed on the substrate S, a first insulating layer FIL is formed to cover the semiconductor pattern SP. The first insulating layer FIL may be formed of an organic layer, an oxide layer, or a nitride layer.

Figure 9:
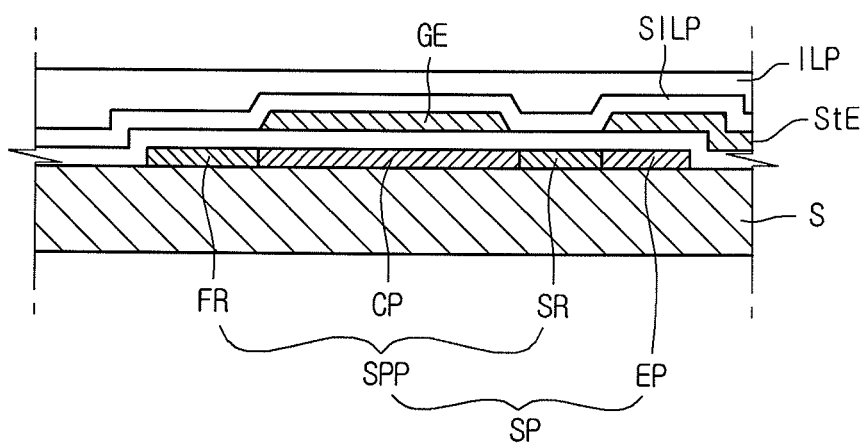
FIG. 9 is a sectional view of a second insulating layer and an interlayer insulating layer covering the semiconductor pattern of FIG. 8.

FIG. 9 is a sectional view of a second insulating layer and an interlayer insulating layer covering the semiconductor pattern of FIG. 8.

Referring to FIG. 9, after the first insulating layer FIL is formed on the substrate S, a gate electrode GE and a storage StE are formed on the first insulating layer FIL. The gate electrode GE may be formed in spaced relationship with the semiconductor pattern portion SPP.

Then, n-type or p-type conductive impurities are doped into the semiconductor pattern SP by using the gate electrode GE as a mask. The n-type or p-type conductive impurities may be doped using an ion implantation process. The conductive impurities are doped into the first region FR and the second region SR of the semiconductor pattern SP, which are not covered by the gate electrode GE. Consequently, the portions corresponding to the first and second regions FR and SR have the conductive characteristic.

Then, a second insulating layer SILD is formed on the first insulating layer FIL to cover the gate electrode GE. Also, an interlayer insulating layer ILP may be further formed on the second insulating layer SILD.

Figure 10:
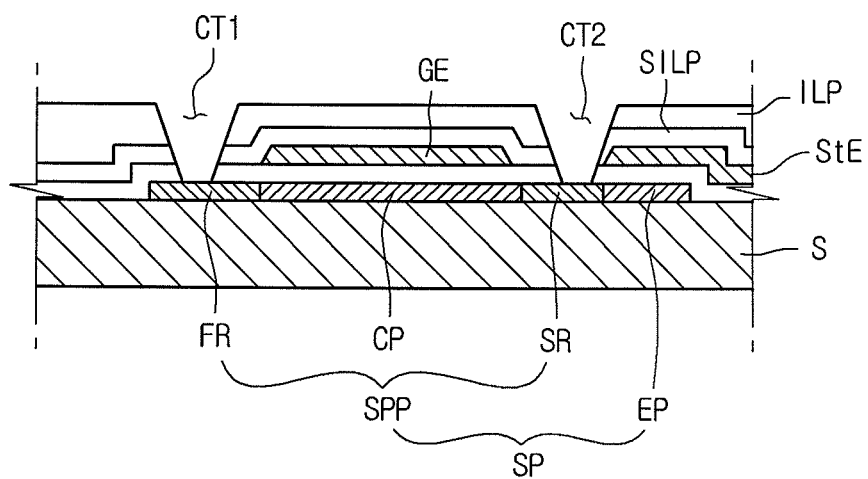
FIG. 10 is a sectional view of an interlayer insulating layer pattern, a second insulating layer pattern, and a first insulating layer pattern, which are formed by patterning an interlayer insulating layer, a second insulating layer, and a first insulating layer.

FIG. 10 is a sectional view of an interlayer insulating layer pattern, a second insulating layer pattern, and a first insulating layer pattern, which are formed by patterning the interlayer insulating layer, the second insulating layer, and the first insulating layer.

Referring to FIG. 10, after the second insulating layer SILD and the interlayer insulating layer ILP are formed on the first insulating layer FIL, the interlayer insulating layer ILP, the second insulating layer SILD and the first insulating layer FIL are patterned to form a first insulating layer pattern FILP, a second insulating layer pattern SILP and an interlayer insulating layer pattern ILPP. The insulating layers FILP, SILP and ILPP have a pair of contact holes CT1 and CT2 exposing the first and second regions FR and SR of the semiconductor pattern SP. In this embodiment, the contact holes CT1 and CT2 are formed on both sides of the gate electrode GE.

Figure 11:
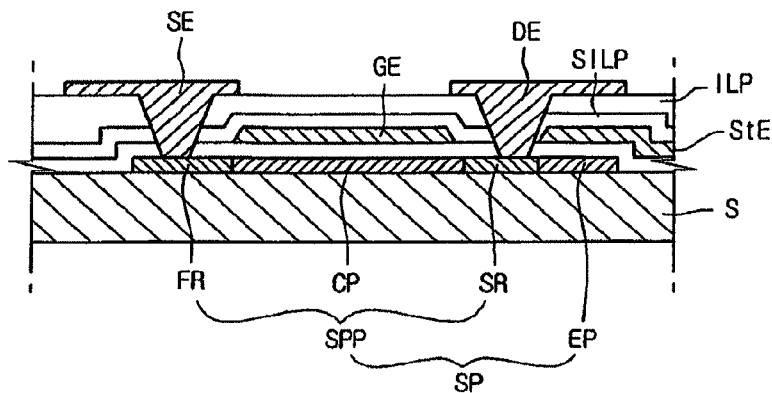
FIG. 11 is a sectional view of a source electrode and a drain electrode formed on the interlayer insulating layer pattern of FIG. 10.

FIG. 11 is a sectional view of a source electrode and a drain electrode formed on the interlayer insulating layer pattern of FIG. 10.

Referring to FIG. 11, a source/drain metal layer (not shown) is formed on the patterned interlayer insulating layer pattern ILPP. The source/drain metal layer may be formed of aluminum, aluminum alloy, chrome, or chrome alloy.

Then, the source/drain metal layer is patterned using a photolithography process, thereby forming a source electrode SE and a drain electrode DE on the interlayer insulating layer pattern ILPP.

The source electrode SE and the drain electrode DE are electrically connected to the first region FR and the second region SR of the semiconductor pattern SP through the contact holes CT1 and CT2.

A large amount of metal ions from the source electrode SE and the drain electrode DE may be provided to the first region FR and the second region SR. However, the anti-diffusion portion EP prevents the metal ions from being diffused to the semiconductor pattern portion SPP interposed between the first region FR and the second region SR. Therefore, it is possible to prevent the length of the semiconductor pattern portion SPP from being reduced, or the semiconductor pattern portion SPP from being conductive.

Display Substrate

Figure 12:
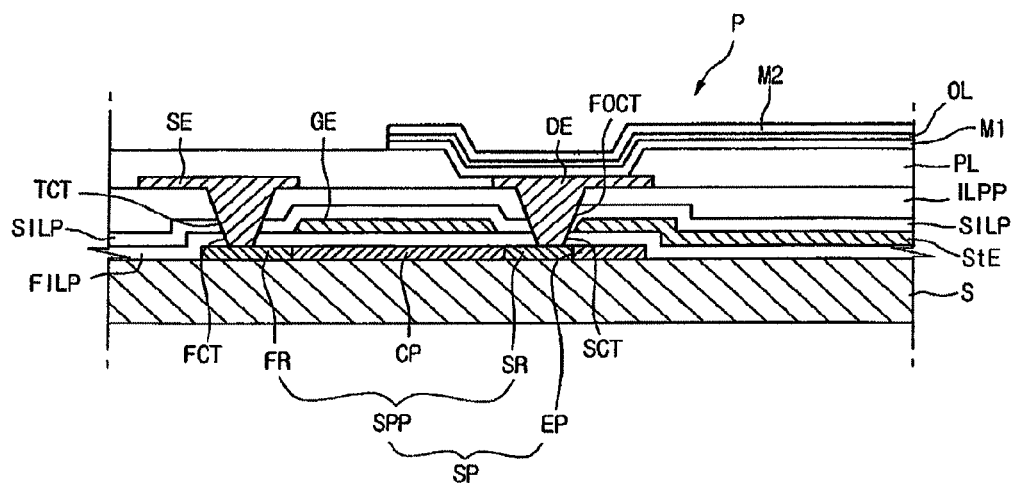
FIG. 12 is a sectional view of a display in accordance with one embodiment of the present invention.

FIG. 12 is a sectional view of a display substrate in accordance with one embodiment of the present invention.

Referring to FIG. 12, the display substrate includes a substrate S, a TFT, and a pixel P.

The substrate S may be a transparent substrate having transmittance similar to that of a glass substrate.

The TFT is disposed on the substrate S to transfer a signal to the pixel P during a predetermined time.

The TFT includes a semiconductor pattern SP, a first insulating layer pattern FILP, a gate electrode GE, a second insulating layer pattern SILP, a source electrode SE, and a drain electrode DE.

The semiconductor pattern SP formed of polysilicon has a cuboid dog-bone shape in a plan view, and the semiconductor pattern SP includes a semiconductor pattern portion SPP and a anti-diffusion portion EP protruding from the semiconductor pattern portion SPP.

The semiconductor pattern portion SPP has a conductive or nonconductive characteristic according to application/interrupt of an external voltage. The semiconductor pattern portion SPP includes a first region FR formed at a first end of the semiconductor pattern portion SPP, a second region SR formed at a second end opposite to the first end, and a channel portion CP interposed between the first region FR and the second region SR. In this embodiment, n-type or p-type impurities are doped into the first region FR and the second region SR. Therefore, the semiconductor pattern portion SPP corresponding to the first and second regions FR and SR has conductive characteristics.

Meanwhile, the channel portion CP has a semiconductor characteristic according to appliance/interrupt of the external voltage.

The anti-diffusion portion EP protrudes from the side of the semiconductor pattern portion SPP along the substrate S by a predetermined length. The anti-diffusion portion EP prevents the metal ions from being diffused from the source electrode SE and the drain electrode DE toward the channel portion CP. The source electrode SE and the drain electrode DE are electrically connected to the first region FR and the second region SR of the semiconductor pattern portion SPP, respectively.

The anti-diffusion portion EP may protrude or extend from the side of the semiconductor pattern portion SPP along the substrate S. Also, the anti-diffusion portion EP may have a pin shape. In addition, at least two pin-shaped anti-diffusion portion EP may be arranged in a fork shape.

The anti-diffusion portion EP may be formed in both the source electrode SE and the drain electrode DE. Also, the anti-diffusion portion EP may be selectively formed only in the source electrode SE. Alternatively, the anti-diffusion portion EP may be selectively formed only in the drain electrode DE.

In FIG. 12, the anti-diffusion portion EP protrudes or extends from the second region SR of the semiconductor pattern portion SPP, which is connected to the drain electrode DE.

The anti-diffusion portion EP may protrude in a direction parallel to a length direction of the semiconductor pattern portion SPP having the cuboid shape, such that the metal ions can be diffused more efficiently. Alternatively, the anti-diffusion portion EP may be formed in a radial direction with respect to the semiconductor pattern portion SPP.

Referring again to FIG. 12, the first insulating layer pattern FILP is formed on the substrate S to cover the semiconductor pattern SP. The gate electrode GE and storage electrode StE are formed on the first insulating layer pattern FILP.

The second insulating layer pattern SILP is formed on the first insulating layer pattern FILP to cover the gate electrode GE. An interlayer insulating layer pattern ILLP is formed on the second insulating layer pattern SILP, and a passivation layer PL is formed on the interlayer insulating layer pattern ILLP.

The source electrode SE is electrically connected to the first region FR through the third and first contact holes TCT and FCT, respectively. The drain electrode DE is electrically connected to the second region SR through fourth and second contact holes FOCT and SCT, respectively.

The pixel P is electrically connected to the drain electrode DE. The pixel P may include a first electrode M1 connected to the drain electrode DE. For example, the first electrode M1 used as the pixel P may be a transparent electrode. The first electrode M1 may be formed of indium tin oxide (ITO), indium zinc oxide (IZO), or amorphous indium tin oxide (a-ITO).

The pixel P may further include an organic luminescent layer OL and a second electrode M2 on the first electrode M1. The organic luminescent layer OL emits light using an electric current supplied by the first electrode M1 and the second electrode M2. In this embodiment, the second electrode M2 may be formed of a metal having low work function, for example, aluminum or aluminum alloy.

Figure 13:
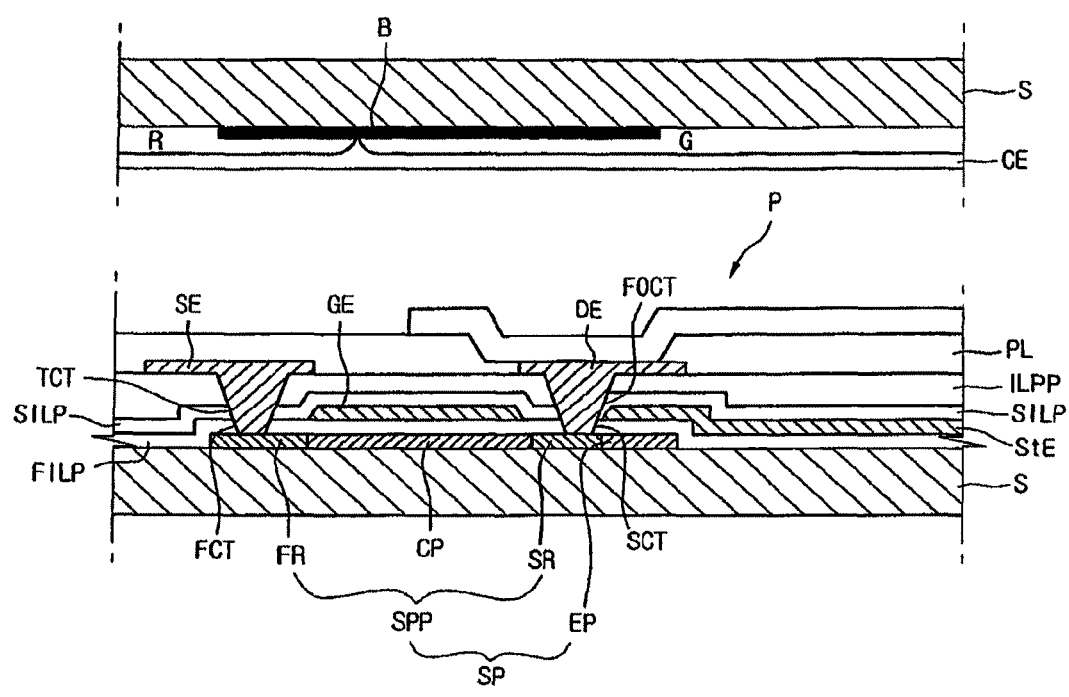
FIG. 13 is a sectional view of a display in accordance with another embodiment of the present invention.

FIG. 13 is a sectional view of a display in accordance with another embodiment of the present invention. In the illustrated embodiment, the pixel P includes a first electrode FE in the lower substrate S connected to the drain electrode DE, a second electrode CE formed in an upper substrate S facing the lower substrate, such that the second electrode is opposite to the first electrode. A red color filter R, a black matrix B, and a green color filter layer G reside on the second substrate between the second electrode CE and the substrate. Although not shown in the figure, a blue color filter also resides on the upper substrate. A liquid crystal layer (not shown) is interposed between the first electrode and the second electrode. The first electrode and the second electrode reside on both sides of the liquid crystal layer may be transparent electrodes.

In the embodiment of FIG. 13, with the exception of the pixel configuration, the structures residing on the lower substrate are similar to the substrate shown in FIG. 12 and described above. The TFT includes a semiconductor pattern SP, a first insulating layer pattern FILP, a gate electrode GE, a second insulating layer pattern SILP, a source electrode SE, and a drain electrode DE.

The semiconductor pattern SP includes a semiconductor pattern portion SPP and an anti-diffusion portion EP extending from the semiconductor pattern portion SPP. The semiconductor pattern portion SPP includes a first region FR formed at a first end of the semiconductor pattern portion SPP, a second region SR formed at a second end opposite to the first end, and a channel portion CP interposed between the first region FR and the second region SR. N-type or p-type impurities are doped into the first region FR and the second region SR. Therefore, the semiconductor pattern portion SPP corresponding to the first and second regions FR and SR has conductive characteristics.

The first insulating layer pattern FILP resides on the substrate S and covers the semiconductor pattern SP. The gate electrode GE is formed on the first insulating layer pattern FILP. The second insulating layer pattern SILP is formed on the first insulating layer pattern FILP to cover the gate electrode GE.

An interlayer insulating layer pattern ILDP overlies the second insulating layer pattern SILP. The interlayer insulating layer pattern ILDP, the second insulating layer pattern SILP, and the first insulating layer pattern FILP include a contact holes FOCT and SCT, respectively, exposing the second region SR. The interlayer insulating layer pattern ILDP, the second insulating layer pattern SILP, and the first insulating layer pattern FILP also include a contact holes TCT and FCT, respectively, exposing the first region FR. A source electrode SE is electrically connected to the first region FR of the semiconductor pattern SP through the contact holes TCT and FTC. A drain electrode DE is electrically connected to the second region SR of the semiconductor patter through the contact holes FOCT and SCT.

An anti-diffusion portion EP protrudes or extends from the second region SR of the semiconductor pattern portion SPP, which is connected to the drain electrode DE. The anti-diffusion portion EP is configured and functions similar to the anti-diffusion portion EP described above.

By forming the anti-diffusion portion at the periphery of the semiconductor pattern, the metal ions provided from the electrode electrically connected to the semiconductor pattern can be prevented from diffusing to the semiconductor pattern. Consequently, the present invention can prevent the performance degradation of the TFT.

It will be apparent to those skilled in the art that various modifications and variations can be made in the present invention. Thus, it is intended that the present invention covers the modifications and variations of this invention provided they come within the scope of the appended claims and their equivalents.

The invention claimed is:

1. A thin film transistor with anti-diffusion portion comprising:
   a substrate;
   a semiconductor pattern including a source region, a drain region, a channel region and an anti-diffusion portion formed on the substrate;
   a first insulating layer on the semiconductor pattern;
   a gate electrode on the first insulating layer;
   a second insulating layer on the gate electrode;
   an interlayer insulating layer pattern formed on the second insulating layer pattern;
   a source electrode and a drain electrode on the second insulating layer and electrically connected to the source region and the drain region through contact holes of the first and second insulating layer;

wherein the anti-diffusion portion protrudes from the source region, the drain region, or both and comprises a plurality of thin extensions, wherein a portion of metal ions from the source electrode and the drain electrode to the channel portion of the semiconductor pattern portion is diffused to the anti-diffusion portion, wherein the anti-diffusion portion reduces a diffusion of metal ions provided to the channel portion of the semiconductor pattern portion by conducting the diffusion of at least a portion of the metal ions from the source electrode and the drain electrode away from the channel portion.

2. The thin film transistor with anti-diffusion portion according to claim 1, wherein the semiconductor pattern comprises a structure having a dog-bone shape in a plan view, and wherein the anti-diffusion portion extends in a direction parallel to a length direction of semiconductor pattern.

* * * * *